(12) United States Patent
Tanida et al.

(10) Patent No.: US 8,237,285 B2
(45) Date of Patent: Aug. 7, 2012

(54) SEMICONDUCTOR DEVICE, THROUGH HOLE HAVING EXPANSION PORTION AND THIN INSULATING FILM

(75) Inventors: Kazumasa Tanida, Kanagawa-ken (JP);
Mie Matsuo, Kanagawa-ken (JP);
Masahiro Sekiguchi, Kanagawa-ken (JP); Chiaki Takubo, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 270 days.

(21) Appl. No.: 12/533,492

(22) Filed: Jul. 31, 2009

(65) Prior Publication Data
US 2010/0025860 A1    Feb. 4, 2010

(30) Foreign Application Priority Data
Jul. 31, 2008  (JP) .................................. 2008-197206

(51) Int. Cl.
*H01L 21/70* (2006.01)
*H01L 29/40* (2006.01)
*H01L 23/48* (2006.01)
*H01L 23/52* (2006.01)

(52) U.S. Cl. ........ 257/774; 257/508; 257/621; 257/758; 257/773; 257/E23.011; 257/E21.597

(58) Field of Classification Search ................. 257/508, 257/621, 698, 758, 773, 774, E23.011, E21.597
See application file for complete search history.

(56) References Cited

U.S. PATENT DOCUMENTS

| | | | |
|---|---|---|---|
| 6,268,619 B1 * | 7/2001 | Kosaki et al. ................ | 257/276 |
| 6,768,205 B2 | 7/2004 | Taniguchi et al. | |
| 6,825,566 B1 * | 11/2004 | Sakata et al. ................. | 257/774 |
| 7,141,493 B2 * | 11/2006 | Masuda ........................ | 438/618 |
| 7,339,273 B2 | 3/2008 | Kameyama et al. | |
| 2004/0207089 A1 * | 10/2004 | Masuda ........................ | 257/758 |
| 2007/0267754 A1 * | 11/2007 | Kirby et al. .................. | 257/774 |
| 2008/0067689 A1 * | 3/2008 | Barth .......................... | 257/774 |

FOREIGN PATENT DOCUMENTS
WO         2005022631          3/2005

* cited by examiner

*Primary Examiner* — Teresa M Arroyo
(74) *Attorney, Agent, or Firm* — Turocy & Watson, LLP

(57) ABSTRACT

Semiconductor device includes semiconductor substrate, through hole having first opening and second opening, and including an expansion portion so that an opening area of first opening is greater than an opening area of lowermost portion of expansion portion, first insulating layer, and having an opening which communicates with through hole and has an area smaller than opening area of first opening, first wiring layer provided on first insulating layer, second insulating layer provided on expansion portion of through hole, and to cover first opening and an inner wall surface of through hole, second insulating layer having an opening communicating with opening of first insulating layer so as to expose first wiring layer through opening of first insulating layer, and second wiring layer provided on second insulating layer to extend from inside of through hole, and being connected to first wiring layer via openings of first and second insulating layers.

11 Claims, 5 Drawing Sheets

SEMICONDUCTOR DEVICE, THROUGH HOLE HAVING EXPANSION PORTION AND THIN INSULATING FILM

CROSS REFERENCE TO RELATED APPLICATION

This application is based upon and claims the benefit of priority from Japanese Patent Application No. 2008-197206, filed on Jul. 31, 2008, the entire contents of which are incorporated herein by reference.

BACKGROUND

Semiconductor devices using a semiconductor integrated circuit technique, such as charge coupled device (CCD) or complementary metal oxide semiconductor (CMOS) image sensors, are widely used in digital cameras and portable phones with camera functions. In response to miniaturization and weight reduction of parts to be mounted on such a semiconductor device, a technique is proposed in which a sensor chip (semiconductor element) is packaged in a chip size package (CSP). A method for packaging a semiconductor element such as a sensor chip in the CSP is to provide a semiconductor substrate having sensor devices or the like formed thereon with a through electrode that connects the front and back surfaces of the semiconductor substrate (see, the pamphlet of International Patent Publication No. WO2005/022631).

The semiconductor device as described above is manufactured as follows, for example. Firstly, a through hole is formed in a semiconductor substrate on which a front insulating film and a front wiring layer are formed in this order so as to expose the front insulating film through the through hole. Then, a back insulating film is formed on the inner wall surface of the through hole and the back surface of the semiconductor substrate. Thereafter, the front and back insulating films are etched so that the front wiring layer can be exposed to the inside of the through hole. Then, a through wiring layer is formed to extend from the inside of the through hole to the back surface of the semiconductor substrate so as to be connected to the front wiring layer via the through hole. After that, an external connection terminal is formed on the through wiring layer. In this way, multiple semiconductor devices as described above are formed on a semiconductor wafer, which is eventually cut into pieces.

The insulating film formed on the inner wall surface of the through hole is desired to have leakage resistance properties comparable to a thermally-oxidized film. However, it is difficult to form an insulating film by using such a high-temperature process as used to form a thermally-oxidized film, if the insulating film is to be formed on a semiconductor substrate on which an integrated circuit has been already formed. Moreover, an image sensor has a microlens array and a color filter which are made of an organic material and formed on a surface of the image sensor, and thus an allowable temperature at formation of the insulating film is around 200° C. Accordingly, as the insulating film in the through hole, used is an $SiO_2$ film formed by a low-temperature formation technique such as a CVD method.

However, if the insulating film is an $SiO_2$ film formed by a low-temperature formation technique, the insulating film tends to be thin at the corner between the sidewall and the bottom of the through hole. This might lead to current leakage at the interface between the semiconductor substrate and the through wiring layer, and thus to malfunctions of the sensor device or the like. This eventually reduces a manufacturing yield and electrical reliability of the semiconductor device. Moreover, stress concentration is likely to occur at the corner of the bottom of the through hole. Accordingly, if such a thin insulating film is employed, cracking might occur therein, which reduces reliability of the semiconductor device. In order to increase the thickness of the insulating film at the corner, the entire insulating film on the sidewall may be formed with an increased thickness. However, the insulating film in which the entire area is increased in thickness cannot be applied on the through hole having a small diameter.

SUMMARY

Aspects of the invention relate to an improved semiconductor device.

In one aspect of the present invention, a semiconductor device, may include a semiconductor substrate having a first surface and a second surface opposite to the first surface, a through hole provided in the semiconductor substrate, the through hole having a first opening on the first surface and a second opening on the second surface, and including an expansion portion which is provided in a vicinity of the first surface so that an opening area of the first opening is greater than an opening area of a lowermost portion of the expansion portion, a first insulating layer provided on the first surface of the semiconductor substrate, and having an opening which communicates with the through hole and has an area smaller than the opening of the first opening, a first wiring layer provided on the first insulating layer to close the opening of the first insulating layer, a second insulating layer provided on the expansion portion of the through hole, and to cover the first opening and an inner wall surface of the through hole, the second insulating layer having an opening communicating with the opening of the first insulating layer so as to expose the first wiring layer through the opening of the first insulating layer, and a second wiring layer provided on the second insulating layer to extend from inside of the through hole to the second surface of the semiconductor substrate, the second wiring layer being connected to the first wiring layer via the openings of the first and second insulating layers.

In another aspect of the invention, a method of manufacturing a semiconductor device, may include forming a first insulating layer on a first surface of a semiconductor substrate, forming a first wiring layer on the first insulating layer, forming a through hole in the semiconductor substrate from a second surface of the semiconductor substrate to the first surface so as to expose the first insulating layer through the through hole, while providing the through hole with an expansion portion in which the through hole is expanded in a vicinity of the first surface so that an opening area of a first opening is larger than an inside area of an inside area side closer to a second opening, the second surface being opposite to the first surface, the first and second openings opening respectively on the first and second surfaces, forming a second insulating layer to be filled in the expansion portion of the through hole, and to cover the first opening and an inner wall surface of the through hole, forming openings respectively in the first and second insulating layers that lie on a bottom of the through hole so as to expose the first wiring layer to inside of the through hole, and forming an second wiring layer on the second insulating layer to extend from the inside of the through hole to the second surface of the semiconductor substrate, the second wiring layer being connected to the first wiring layer via the openings of the respective first and second insulating layers.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION

Figure 1:
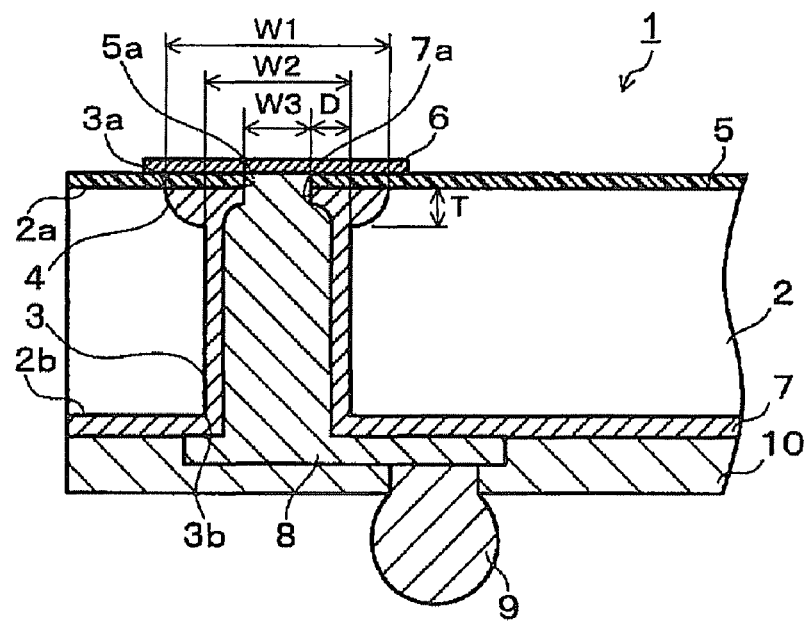
FIG. 1 shows a semiconductor device according to a first embodiment of the present invention.

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

First Embodiment

Hereinafter, embodiments of the present invention will be described with reference to the drawings. FIG. 1 shows a semiconductor device according to a first embodiment of the present invention. A semiconductor device 1 shown in FIG. 1 includes a semiconductor substrate 2. The semiconductor substrate 2 is a silicon (Si) substrate, for example. The semiconductor substrate 2 has a first surface 2a and a second surface 2b opposite thereto. On the first surface (the front surface of the semiconductor substrate 2) 2a, wiring, electrodes, an integrated circuit including photodiodes and transistors, and the like (not shown in FIG. 1) are formed. On the second surface (the back surface of the semiconductor substrate 2) 2b, an external connection terminal is formed.

The semiconductor substrate 2 has a through hole 3 connecting the first surface 2a to the second surface 2b. The through hole 3 has a first opening 3a that opens on the first surface 2a and a second opening 3b that opens on the second surface 2b. The through hole 3 is provided with an expansion portion 4 in the vicinity of the first surface 2a so as to be expanded near the first surface 2a. The expansion portion 4 is formed such that an opening diameter W1 of the first opening 3a can be larger than an inner diameter W2 of a side closer to the second opening 3b (this side will be referred to as "inside diameter side" below). The first opening 3a of the through hole 3 corresponds to the starting end of the expansion portion 4, while the inside diameter side located closer to the second opening 3b of the through hole 3 corresponds to the terminal end of the expansion portion 4.

The expansion portion 4 is formed such that the curved surface thereof can continuously connect the first opening (starting end) 3a to the inside diameter side (terminal end) located closer to the second opening 3b. The expansion portion 4 may be formed of one or more curved surfaces each having a certain curvature, two or more flat surfaces, or a combination thereof. The portion of the through hole 3 in the vicinity of the first surface 2a has an increased inside diameter as compared to the rest of the through hole 3. The expansion portion 4, which is equivalent to this portion having the increased inside diameter, is provided in a manner that the inside diameter thereof increases, for example, continuously from the terminal end to the starting end. The inside diameter of the expansion portion 4 may be increased intermittently, instead.

A first insulating layer 5 is formed on the first surface 2a of the semiconductor substrate 2, and a first wiring layer 6 is formed on the first insulating layer 5. The first wiring layer 6 is a conductive layer for a semiconductor circuit, and is provided in an active element region on the first surface 2a of the semiconductor substrate 2. When the semiconductor device 1 is used as a sensor chip such as a CMOS image sensor, the active element region on the first surface 2a of the semiconductor substrate 2 is provided with a light-receiving unit having one or more light-receiving elements such as photodiodes. The light-receiving unit receives energy beams, such as light or electron energy beams, with which the first surface 2a is irradiated, and collects the energy beams by using the photodiodes. The light-receiving unit described above constitutes an imager of the sensor chip, and is electrically connected to the first wiring layer 6 that performs operations such as input and output of an electrical signal, and power supply.

The first insulating layer 5 provided on the first surface 2a of the semiconductor substrate 2 has an opening 5a having an opening diameter W3 that is smaller than the opening diameter W1 of the first opening 3a of the through hole 3. The opening 5a of the first insulating layer 5 is formed nearly coaxially with the first opening 3a of the through hole 3. The first wiring layer 6 is arranged so as to close the first opening 3a of the through hole 3 and the opening 5a of the first insulating layer 5. In other words, the first wiring layer 6 is exposed to the inside of the through hole 3, and thus this first wiring layer 6 forms the bottom of the through hole 3.

The inner wall surface (side surface) of the through hole 3 and the first opening 3a are covered with a second insulating layer 7, which has an opening 7a communicating with the opening 5a of the first insulating layer 5 to expose the first wiring layer 6 therethrough. The opening 7a of the second insulating layer 7a is provided coaxially with the opening 5a of the first insulating layer 5, and has approximately the same opening diameter (W3) as the opening 5a. The expansion portion 4 of the through hole 3 is filled with the second insulating layer 7. Moreover, the second insulating layer 7 is provided so as to at least partially cover the second surface 2b of the semiconductor substrate 2 continuously from the inner wall surface of the through hole 3. In other words, the second insulating layer 7 is provided: to fill the expansion portion 4; to cover the inner wall surface of the through hole 3; to partially cover the first opening 3a; and to at least partially cover the second surface 2b of the semiconductor substrate 2.

The through hole 3 is filled with a conductive material to serve as a second wiring layer 8 with the second insulating layer 7 interposed therebetween. The second insulating layer 7 lying on the side including the first opening 3a of the through hole 3 is provided with the opening 7a, while the first insulating layer 5 is provided with the opening 5a just under the opening 7a. Accordingly, the second wiring layer 8 is electrically connected to the first wiring layer 6 via the openings 7a and 5a. The second wiring layer 8 is provided to extend from the inside of the through hole 3 to the second surface 2b of the semiconductor substrate 2. The second wiring layer 8 is a through wiring layer that connects the first surface 2a of the semiconductor substrate 2 to the second surface 2b thereof.

At a corner of the through hole 3 on the side including the first opening 3a, the second insulating layer 7 filled in the expansion portion 4 is interposed between the semiconductor substrate 2 and the second wiring layer 8. The expansion portion 4 has a shape defined by a distance (length in the direction parallel to the first surface 2a) D and a distance (depth) T. Here, the distance D (=(W1−W3)/2) extends from the opening edge of the first opening 3a to the opening edge of the opening 7a of the second insulating layer 7, while the distance T extends from the first opening 3a to the inside diameter side located closer to the second opening 3b. The expansion portion 4 having the shape as described above is filled with the second insulating layer 7. The second wiring layer 8 is separated from the semiconductor substrate 2 by the second insulating layer 7 filled in the expansion portion 4.

This structure can reproducibly suppress leakage current generation at the interface between the semiconductor substrate 2 and the second wiring layer 8 at the corner of the through hole 3 on the side including the first opening 3a. Moreover, the structure can suppress cracking and the like in the second insulating layer 7; for the expansion portion 4 filled with the second insulating layer 7 lies at the corner of the through hole 3 on the side including the first opening 3a, where stress concentration is likely to occur. To achieve these effects, the second insulating layer 7 filled in the expansion portion 4 should preferably have the length D in the direction parallel to the first surface 2a ranging from 3 to 10 μm, and the depth T ranging from 1 to 5 μm.

Figure 11:
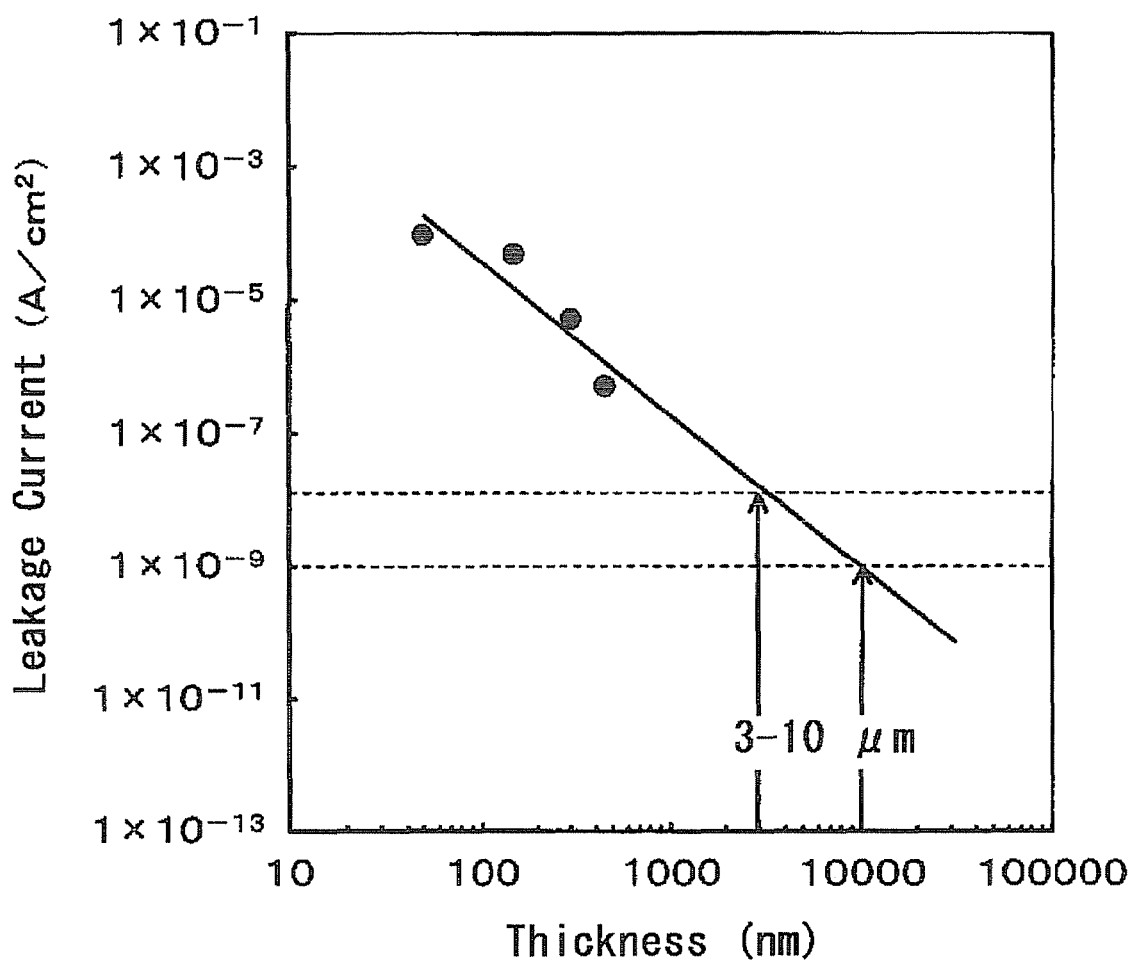
FIG. 11 shows the relation between the leakage current value and the thickness of a conventional insulating film.

FIG. 11 shows the relation between the leakage current value and the thickness of a conventional insulating film (such as an $SiO_2$ film formed by low-temperature formation technique). To provide leakage resistance properties comparable to a thermally-oxidized film (thickness: 100 nm), the insulating film should preferably have a thickness ranging from 3 to 10 μm. To this end, the length D, in the direction parallel to the first surface 2a, of the second insulating layer 7 should preferably range from 3 to 10 μm. Here, a semiconductor device is generally formed by growing an epitaxial layer with a thickness of approximately 5 μm on an Si substrate, and then by placing transistor devices including wells, sources, drains and channels at a depth of approximately 1 μm from the upper surface of the epitaxial layer. Accordingly, it is preferable to improve leakage resistance properties around the depths of 1 μm and 5 μm from the upper surface. To this end, the depth T of the second insulating layer 7 should preferably range from 1 to 5 μm.

If the second insulating layer 7 filled in the expansion portion 4 have the length D in the direction parallel to the first surface 2a less than 3 μm, and the depth T less than 1 μm, the semiconductor device 1 might not achieve sufficient effects to suppress leakage current generation and cracking. To achieve sufficient effects to suppress leakage current generation and cracking, the second insulating layer 7 should preferably have a longer length D in the direction parallel to the first surface 2a. However, a too long length D makes it difficult to apply the second insulating layer 7 onto the through hole 3 having a small diameter, and might lead to problems such as reduction in size of the active element region on the first surface 2a of the semiconductor substrate 2. Therefore, practically, the length D should preferably be not more than 10 μm. Similarly, the depth T should preferably be not more than 5 μm.

An external connection terminal 9 is provided on the second wiring layer 8. The second surface 2b of the semiconductor substrate 2 excluding the external connection terminal 9 is covered with a protective layer 10. The second insulating layer 7 and the second wiring layer 8 lying on the second surface 2b are covered with protective layer 10. The protective layer 10 only needs to cover at least the second wiring layer 8. In this embodiment, the entire second surface 2b of the semiconductor substrate 2 excluding the external connection terminal 9 is covered with the protective layer 10. If the semiconductor device 1 is used in a sensor package or the like, a light-transmissive protective member formed of a glass substrate or the like is placed on the semiconductor substrate 2 with an adhesive layer interposed therebetween. Note, however, that the light-transmissive protective member and the adhesive layer are not shown in FIG. 1 for description simplicity.

Figure 2:
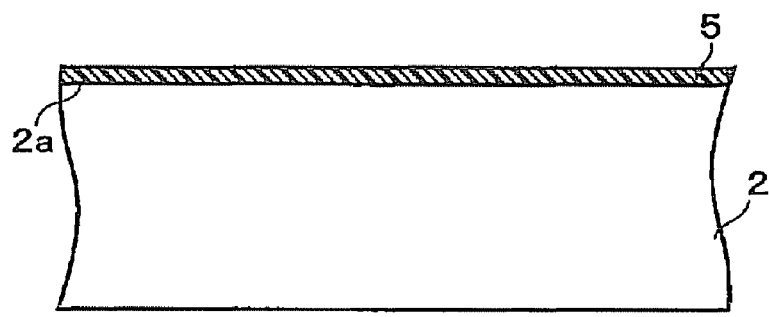
FIGS. 2-8 show a manufacturing method of a semiconductor device according to the first embodiment.

The semiconductor device 1 of the first embodiment is manufactured as follows, for example. Firstly, as shown in FIG. 2, the first insulating layer 5 is formed on the first surface (front surface) 2a of the semiconductor substrate 2 by using a method such as the CVD method, a spray coat method, a spin coat method or a film laminating method. The first insulating layer 5 is made of a material such as a silicon oxide (SiOx), a silicon nitride (SiNx), a SiOF (fluorine-doped SiOx) or a porous SiOC (carbon-doped SiOx). The semiconductor substrate 2 is provided as a semiconductor wafer.

Figure 3:
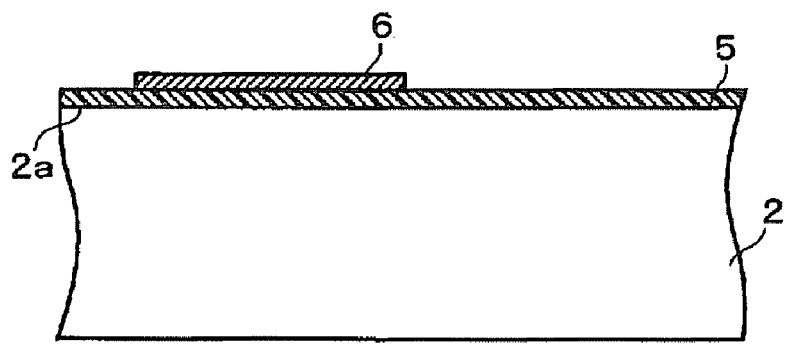

Then, as shown in FIG. 3, the first wiring layer 6 is formed on the first insulating layer 5 by using a method such as a sputtering method, the CVD method, a vapor deposition method or a plating method. For the first wiring layer 6, a high-resistance metal (such as Ti, TiN, TiW, Ni, Cr, TaN or COWP) and/or a low-resistance metal (such as Al, Al—Cu, Al—Si—Cu, Cu, Au, Ag or a solder material) are used, for example. These materials constitute a conductive layer having a single-layer structure or a multilayer structure in which multiple material layers are laminated. Alternatively, as the first wiring layer 6, a film such as a multilayer structure film in which conductive layers are laminated with an insulating layer interposed between each adjacent two conductive layers may be used.

Figure 4:
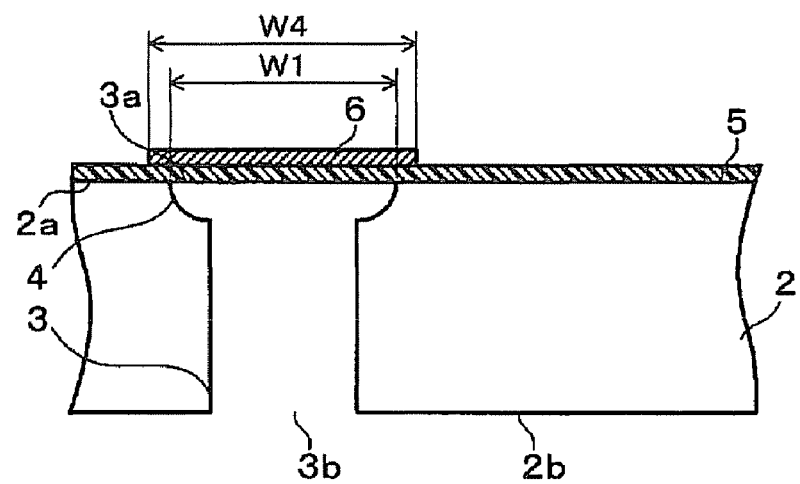

Then, as shown in FIG. 4, the through hole 3 is bored in the semiconductor substrate 2 from the second surface 2b toward the first surface 2a, so that the first insulating layer 5 is exposed through the through hole 3. The through hole 3 should preferably have a cross-sectional shape tapered down toward the first insulating layer 5. The through hole 3 is formed by etching the semiconductor substrate 2 by a method such as plasma etching using a mask having a predetermined pattern and placed on the second surface 2b of the semiconductor substrate 2. In forming the through hole 3, the semiconductor substrate 2 is etched by plasma etching using a plasma into which an etching gas is introduced so that the semiconductor substrate 2 can be etched more largely than the first insulating layer 5.

As the etching gas, a mixed gas of SF6, O2 and Ar is used if the semiconductor substrate 2 is an Si substrate, for example. In plasma-etching the semiconductor substrate 2, overetching is performed still after the first insulating layer 5 is exposed. Thereby, charged etchant components are concentrated in the periphery of the first opening 3a of the through hole 3, which promotes etching in the lateral direction (the direction parallel to the first surface 2a of the semiconductor substrate 2). In this way, by employing overetching, the expansion portion 4 is formed in the vicinity of the first surface 2a.

As described above, the through hole 3 including the expansion portion 4 is formed. Specifically, in the expansion portion 4, the opening diameter W1 of the first opening 3a (the starting end of the expansion portion 4) is larger than the diameter W2 of the inside diameter side (the terminal end of the expansion portion 4) located closer to the second opening 3b. Moreover, the curved surface of the expansion portion 4 continuously connects the first opening 3a to the inside diameter side located closer to the second opening 3b. The opening diameter W1 of the first opening 3a of the through hole 3 (the opening diameter of the starting end of the expansion portion 4) should preferably be smaller than the diameter W4 of the first wiring layer 6 (W1<W4).

Figure 5:
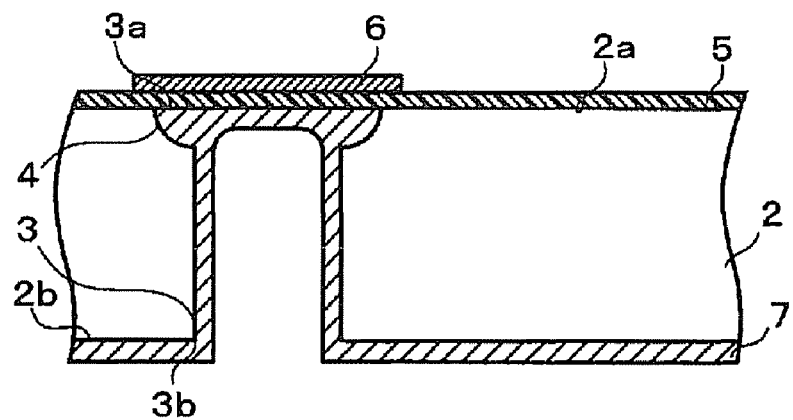

Then, as shown in FIG. 5, the second insulating layer 7 is formed by using a method such as the CVD method, the spray coat method, the spin coat method or the film laminating method. In this step, the second insulating layer 7 is formed so as to cover the inner wall surface of the through hole 3, the bottom of the through hole 3 closed by the first insulating layer 5, and the second surface 2b of the semiconductor substrate 2. What is important here is to form the second insulating layer 7 not only to cover the bottom and the inner wall surface of the through hole 3 and the like, but also to be filled in the expansion portion 4 of the through hole 3.

The second insulating layer 7 is made of an inorganic insulating material such as a silicon oxide (SiOx) or a silicon nitride (SiNx), or an organic insulating material such as a polyimide resin, a benzocyclobutene (BCB) resin or an epoxy resin, for example. Among these materials, the second insulating layer 7 should preferably be made of an organic insulating material such as a polyimide resin, a BCB resin, a parylene resin or an epoxy resin, in consideration of a filling easiness into the expansion portion 4 of the through hole 3. As the method for forming the second insulating layer 7, a method such as the spray coat method or the spin coat method should be preferably used.

Figure 6:
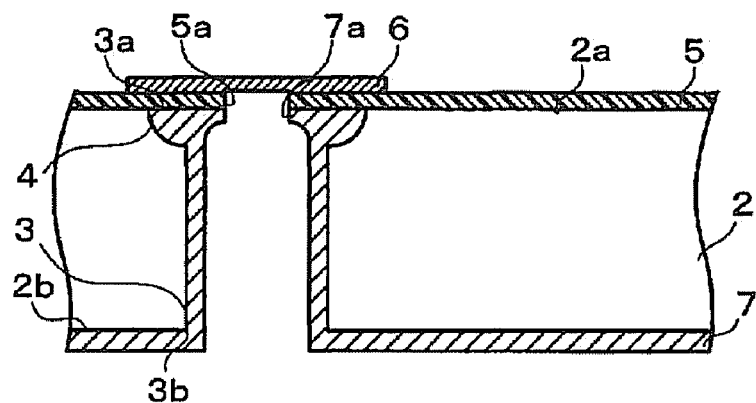

Then, as shown in FIG. 6, the opening 7a is formed by etching the second insulating layer 7 that lies on the bottom of the through hole 3 to cover the first insulating layer 5, by using a mask having a predetermined pattern. Thereby, the first insulating layer 5 is exposed again. Then, the first insulating layer 5 thus exposed is etched, so that the opening 5a having nearly the same diameter of the opening 7a of the second insulating layer 7 is formed. By forming these openings 5a and 7a, the first wiring layer 6 is exposed to the inside of the through hole 3. In this event, the openings 5a and 7a of the respective first and second insulating layers 5 and 7 are formed such that the diameter W3 of these openings 5a and 7a can be smaller than the opening diameter W1 of the first opening 3a of the through hole 3 (the opening diameter of the starting end of the expansion portion 4) (W3<W1).

In etching the first insulating layer 5, employed is plasma etching using a plasma into which an etching gas is introduced so that the first insulating layer 5 can be etched more largely than the first wiring layer 6. As the etching gas, a mixed gas of C5F8, O2 and Ar is used if the first insulating layer 5 is an SiO2 film, and if the first wiring layer 6 is formed of TiN and Al, for example. The second insulating layer 7 and the first insulating layer 5 may be etched either simultaneously or individually.

If the second insulating layer 7 is made of a material similar to that of the first insulating layer 5, the second insulating layer 7 and the first insulating layer 5 are successively etched to form the openings 5a and 7a. If the second insulating layer 7 is made of a material such as a polyimide resin, a BCB resin, a parylene resin or an epoxy resin, the opening 7a can be formed by ashing the second insulating layer 7 with O2 plasma. If the second insulating layer 7 is made of a photosensitive material, the opening 7a may be formed by employing exposure and development steps.

Figure 7:
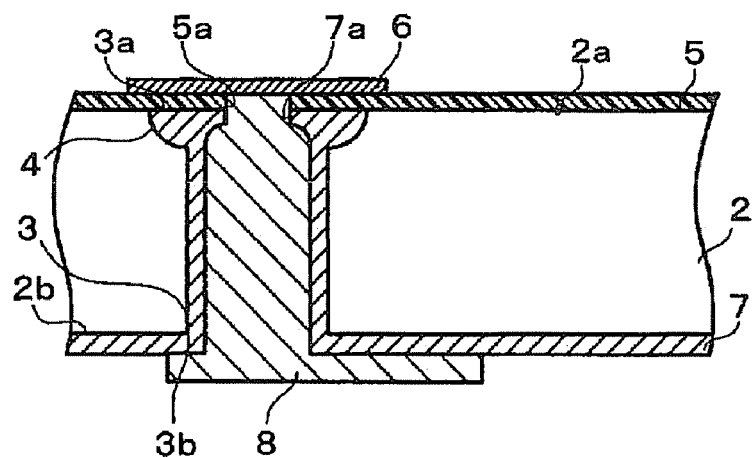

Then, as shown in FIG. 7, the second wiring layer 8 is formed to extend from the inside of the through hole 3 to the second surface 2b of the semiconductor substrate 2. The second wiring layer 8 is formed in the through hole 3 and on the second surface 2b of the semiconductor substrate 2 with the second insulating layer 7 interposed therebetween. Since the first and second insulating layers 5 and 7 lying on the bottom of the through hole 3 has already been provided with the openings 5a and 7a, the second wiring layer 8 is electrically connected to the first wiring layer 6 via the openings 5a and 7a.

The second wiring layer 8 is formed with a mask having a predetermined pattern by using a method such as the sputtering method, the CVD method, the vapor deposition method, the plating method or a lithography method. On the second surface 2b of the semiconductor substrate 2, the second wiring layer 8 is formed on the second insulating layer 7. For the second wiring layer 8, a high-resistance metal (such as Ti, TiN, TiW, Ni, Cr, TaN or COWP) and/or a low-resistance metal (such as Al, Al—Cu, Al—Si—Cu, Cu, Au, Ag or a solder material) are used, for example. These materials constitute a conductive layer having a single-layer or multilayer structure.

Figure 8:
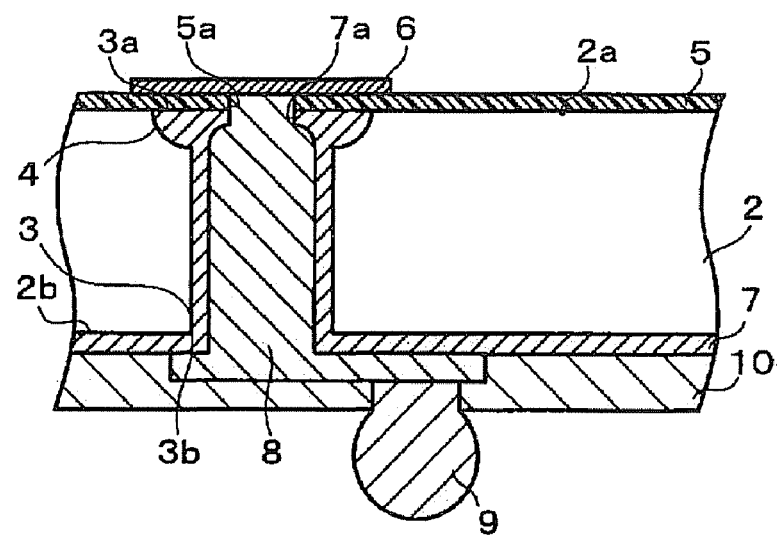

After that, as shown in FIG. 8, the protective layer 10 is formed to cover the second surface 2b of the semiconductor substrate 2. In addition, an opening for forming an terminal therein is formed in the protective layer 10, and the external connection terminal 9 connected to the second wiring layer 8 is then formed in the opening. The external connection terminal 9 is formed of a solder material, for example. The protective layer 10 is formed of a material such as a polyimide resin, an epoxy resin or a solder resist material. After this series of steps (wafer process) is completed, the semiconductor substrate 2 is cut into pieces with a blade. In this way, the semiconductor device 1 shown in FIG. 1 is manufactured.

In the semiconductor device 1 of the first embodiment, the second insulating layer 7 is provided not only to be filled in the expansion portion 4 of the through hole 3, but also to cover the inner wall surface of the through hole 3 and the second surface 2b of the semiconductor substrate 2. In the vicinity of the first opening 3a of the through hole 3, the second insulating layer 7 filled in the expansion portion 4 lies. The second wiring layer 8 is separated from the semiconductor substrate 2 by the second insulating layer 7 filled in the expansion portion 4. This structure can improve leakage resistance properties of the second insulating layer 7 in the expansion portion 4, and thus improves a manufacturing yield and reliability of the semiconductor device 1.

Moreover, the second insulating layer 7 filled in the expansion portion 4 lies at the corner of the through hole 3 on the side including the first opening 3a, where stress concentration is likely to occur. This means that the thickness of the second insulating layer 7 can be increased in this stress concentration region. In this case, stress is distributed in the thick portion of the second insulating layer 7 (the second insulating layer 7 filled in the expansion portion 4), which can suppress cracking and the like attributable to stress concentration in the second insulating layer 7. As described above, the first embodiment makes it possible to provide the semiconductor device 1 having high electrical and mechanical reliability and enabling an improved manufacturing yield.

Figure 9:
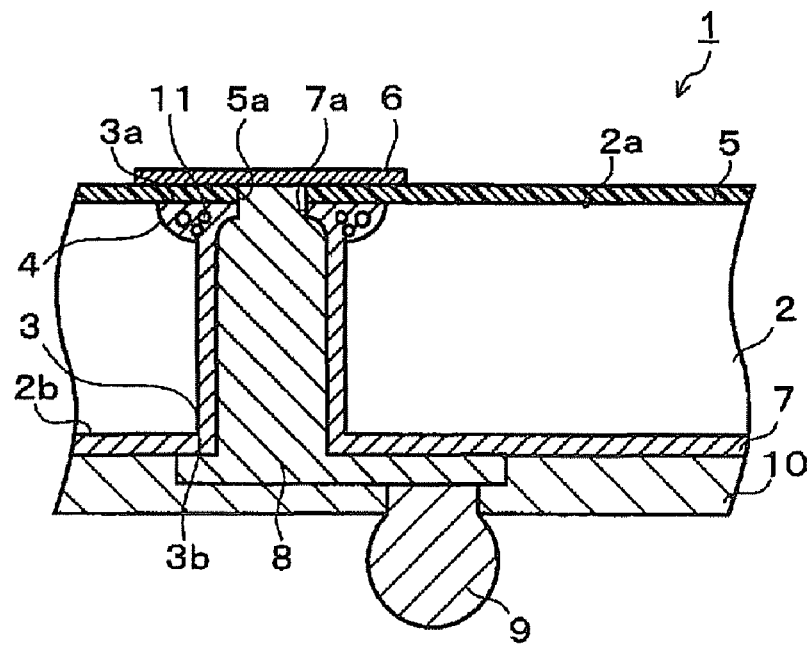
FIG. 9 shows a semiconductor device according to a modification of the first embodiment.

FIG. 9 shows a modification of the semiconductor device 1 of the first embodiment. In the semiconductor device 1 shown in FIG. 9, the second insulating layer 7 filled in the expansion portion 4 of the through hole 3 includes holes 11. In the other points, the semiconductor device 1 shown in FIG. 9 has the same structure as the semiconductor device 1 shown in FIG. 1. The holes 11 reduce the dielectric constant of the second insulating layer 7. By filling the expansion portion 4 with the second insulating layer 7 having such a low dielectric constant, electrical properties of the semiconductor device 1 can be improved.

Second Embodiment

A semiconductor device of a second embodiment of the present invention will be described with reference to FIG. 10.

Figure 10:
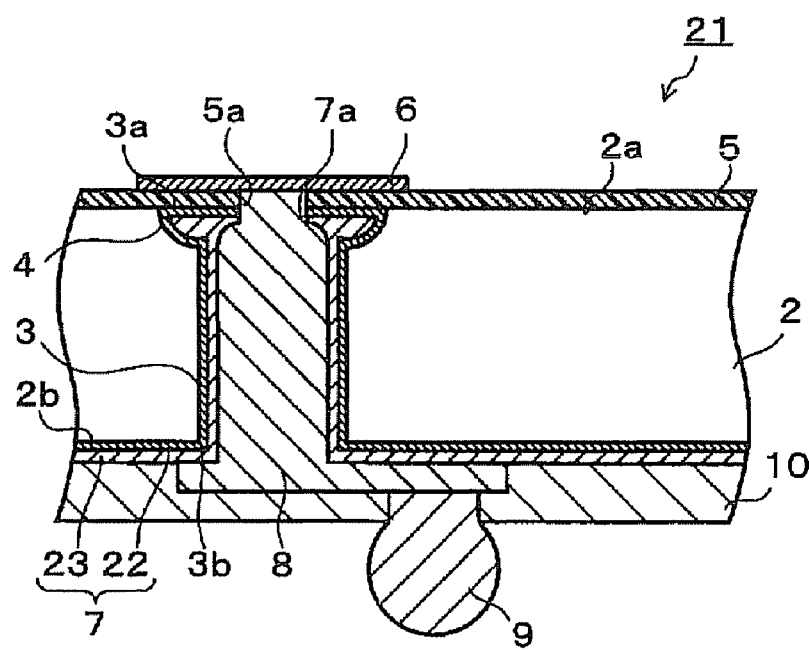
FIG. 10 shows a semiconductor device according to a second embodiment of the present invention.

FIG. 10 shows a semiconductor device 21 of the second embodiment. The semiconductor device 21 shown in FIG. 10 has the same structure as the semiconductor device 1 of the first embodiment except for the structure of the second insulating layer. In the semiconductor device 21 shown in FIG. 10, the same parts as in the semiconductor device 1 of FIG. 1 are denoted by the same reference numerals, and the description thereof will be partially omitted.

In the semiconductor device 21 shown in FIG. 10, the inner wall surface of the through hole 3 and the second surface 2b of the semiconductor substrate 2 are covered with a thin underlying film 22. The underlying film 22 is formed along the expansion portion 4 and the first insulating layer 5 that serves as the bottom of and the through hole 3. On the underlying film 22, an insulating film 23 is formed. In other words, the second insulating layer 7 is a bilayer structure film formed of the underlying film 22 and the insulating film 23. The opening 7a is formed in the second insulating layer 7 having the bilayer structure, so that the first wiring layer 6 is exposed to the inside of the through hole 3 via this opening 7a and the opening 5a of the first insulating layer 5.

The underlying film 22 is formed by a method such as the CVD method, the spray coat method, the spin coat method or the film laminating method. The underlying film 22 is made of an inorganic insulating material such as a silicon oxide (SiOx) or a silicon nitride (SiNx), or an organic insulating material such as a polyimide resin, a BCB resin, a parylene resin or an epoxy resin. Among these materials, the second insulating layer 7 should preferably be made of a silicon oxide, a silicon nitride or the like, in consideration of an adhesion property to the semiconductor substrate 2. The underlying film 22 needs only to thinly cover the inner wall surface of the through hole 3 and the like, and does not need to be filled in the expansion portion 4.

The insulating film 23 is formed by a method such as the CVD method, the spray coat method, the spin coat method or the film laminating method. The insulating film 23 is made of an inorganic insulating material such as a silicon oxide (SiOx) or a silicon nitride (SiNx), or an organic insulating material such as a polyimide resin, a BCB resin, a parylene resin or an epoxy resin, for example. Among these materials, the insulating film 23 should preferably be made of an organic insulating material such as a polyimide resin, a BCB resin, a parylene resin or an epoxy resin, in consideration of a filling easiness into the expansion portion 4. The insulating film 23 is formed not only to cover the underlying film 22, but also to be filled in the expansion portion 4 of the through hole 3.

In the second insulating layer 7 having the underlying film 22 and the insulating film 23, the opening 7a (an opening in which an opening of the insulating film 23 communicates with an opening of the underlying film 22), as in the first embodiment. Moreover, the opening 5a is provided in the first insulating layer 5 coaxially with the opening 7a of the second insulating layer 7. Via the openings 5a and 7a of the respective first and second insulating layers 5 and 7, the second wiring layer 8 filled in through hole 3 is electrically connected to the first wiring layer 6 provided on the first surface 2a of the semiconductor substrate 2.

By employing, as the second insulating layer 7, the bilayer structure film formed of the underlying film 22 and the insulating film 23, the second insulating layer 7 can be improved in both adhesion property to the semiconductor substrate 2 and filling easiness into the expansion portion 4. More specifically, in this embodiment, the underlying film 22 is made of an insulating material with a good adhesion property to the semiconductor substrate 2 and the insulating film 23, while the insulating film 23 is formed of an insulating material with a good filling easiness into the expansion portion 4. Thereby, the second insulating layer 7 can be improved in both adhesion property to the semiconductor substrate 2 and filling easiness into the expansion portion 4. These can improve mechanical and electrical reliability of the semiconductor device 1 much more.

Embodiments of the invention have been described with reference to the examples. However, the invention is not limited thereto.

In the embodiments, the through hole 3 has a circle in a plan view. However, the plan view shape of the through hole 3 is not limited to the circle. The plan view shape of the through hole 3 may be an ellipse shape, polygon shape or the like.

In the embodiments, the cross sectional view of the through hole 3 is substantially perpendicular to the surfaces of the semiconductor substrate 2. However, the cross sectional view of the through hole 3 is not limited to this. The through hole 3 may be angled to the front and/or back surface of the semiconductor substrate 2 in the cross sectional view.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor device, comprising:
  a semiconductor substrate having a first surface and a second surface opposite to the first surface;
  a through hole provided in the semiconductor substrate, the through hole having a first opening on the first surface and a second opening on the second surface, and including an expansion portion which is provided in a vicinity of the first surface so that an opening area of the first opening is greater than an opening area of a lowermost portion of the expansion portion;
  a first insulating layer provided on the first surface of the semiconductor substrate, and having an opening which communicates with the through hole and has an area smaller than the opening area of the first opening;
  a first wiring layer provided on the first insulating layer to close the opening of the first insulating layer;
  a second insulating layer provided on the expansion portion of the through hole, and to cover the first opening and an inner wall surface of the through hole, the second insulating layer having an opening communicating with the opening of the first insulating layer so as to expose the first wiring layer through the opening of the first insulating layer; and
  a second wiring layer provided on the second insulating layer to extend from inside of the through hole to the second surface of the semiconductor substrate, the second wiring layer being connected to the first wiring layer via the openings of the first and second insulating layers.

2. The semiconductor device according to claim 1, wherein the expansion portion has a shape whose length from an opening edge of the first opening to an opening edge of the opening of the second insulating layer ranges from 3 to 10 μm, and whose length from the first opening to the inside diameter side closer to the second opening ranges from 1 to 5 μm.

3. The semiconductor device according to claim 1, wherein the expansion portion is filled with the second insulating layer made of an organic insulating material.

4. The semiconductor device according to claim 1, wherein the second insulating layer has a bilayer structure film formed of an underlying film and an insulating film, and the expansion portion is filled with the insulating film.

5. The semiconductor device according to claim 1, wherein the opening area in the expansion portion is greater than the opening area in the uppermost portion of the through hole other than the expansion portion.

6. The semiconductor device according to claim 1, wherein the expansion portion has a curved surface.

7. The semiconductor device according to claim 1, wherein a portion of the through hole in the vicinity of the first surface of the semiconductor substrate has an increased opening area as compared to another portion of the through hole.

8. The semiconductor device according to claim 1, wherein the opening area of the expansion portion is greater than the opening area of the through hole at the second surface.

9. The semiconductor device according to claim 1, wherein the through hole has a connecting portion provided between the expansion portion and the second opening, and the connecting portion is substantially perpendicular to the first surface of the semiconductor substrate.

10. The semiconductor device according to claim 1, wherein the opening area of the second insulating layer is smaller than the opening area of a lowermost portion of the expansion portion.

11. The semiconductor device according to claim 1, wherein the expansion portion has a quadrant surface.

* * * * *